(12) United States Patent
Wang

(10) Patent No.: US 12,492,335 B2
(45) Date of Patent: Dec. 9, 2025

(54) QUANTUM DOT LIGAND AND METHOD FOR PREPARING THE SAME, LIGHT EMITTING DEVICE AND METHOD FOR PREPARING THE SAME, AND DISPLAY DEVICE

(71) Applicant: BOE Technology Group Co., Ltd., Beijing (CN)

(72) Inventor: Tieshi Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 579 days.

(21) Appl. No.: 17/624,742

(22) PCT Filed: Mar. 3, 2021

(86) PCT No.: PCT/CN2021/078885
§ 371 (c)(1),
(2) Date: Jan. 4, 2022

(87) PCT Pub. No.: WO2021/175251
PCT Pub. Date: Sep. 10, 2021

(65) Prior Publication Data
US 2022/0243123 A1    Aug. 4, 2022

(30) Foreign Application Priority Data

Mar. 5, 2020   (CN) .......................... 202010149384.9

(51) Int. Cl.
*H01L 51/50*   (2006.01)
*C07C 319/10*  (2006.01)
(Continued)

(52) U.S. Cl.
CPC ............ *C09K 11/06* (2013.01); *C07C 319/10* (2013.01); *C07C 323/48* (2013.01); *H10K 85/60* (2023.02);
(Continued)

(58) Field of Classification Search
None
See application file for complete search history.

(56) References Cited

U.S. PATENT DOCUMENTS

2019/0064604 A1*   2/2019   Tsuchiya ........... G02F 1/133703

FOREIGN PATENT DOCUMENTS

| CN | 109935709 A | 6/2019 |
| CN | 110055052 A | 7/2019 |
| CN | 110564232 A | 12/2019 |

OTHER PUBLICATIONS

Javed et. at., Fluorescence modulation of cadmium sulfide quantum dots by azobenzene photochromic switches; Proc. R. Soc. A 472: 2015, pp. 1-12 (Year: 2015).*

(Continued)

*Primary Examiner* — Gregory D Clark
(74) *Attorney, Agent, or Firm* — IPro, PLLC

(57) ABSTRACT

The present disclosure provides a quantum dot ligand and a method for preparing the same, a light emitting device and a method for preparing the same, and a display device. The quantum dot ligand is an azobenzene compound represented by formula (I). The azobenzene compound in the quantum dot ligand of the present disclosure has at least one group on each benzene ring, and the groups on the benzene rings of the azobenzene compound can be connected to the quantum dot through a coordination bond, thereby forming a network or chain structure.

19 Claims, 4 Drawing Sheets

(51) Int. Cl.
*C07C 323/48* (2006.01)
*C09K 11/06* (2006.01)
*H10K 85/60* (2023.01)
*H10K 50/115* (2023.01)
*H10K 71/00* (2023.01)
*H10K 71/12* (2023.01)
*H10K 71/40* (2023.01)

(52) U.S. Cl.
CPC .............. *C09K 2211/1007* (2013.01); *C09K 2211/1014* (2013.01); *H10K 50/115* (2023.02); *H10K 71/00* (2023.02); *H10K 71/12* (2023.02); *H10K 71/40* (2023.02)

(56) References Cited

OTHER PUBLICATIONS

Zhang, Shi-Yuan, et al. "Dual-functionalized metal organic frameworks constructed from hexatopic ligand for selective CO2 adsorption." Inorganic Chemistry 54.5 (2015): 2310-2314.
Javed, Hina, et al. "Fluorescence modulation of cadmium sulfide quantum dots by azobenzene photochromic switches." Proceedings of the Royal Society A: Mathematical, Physical and Engineering Sciences 472.2186 (2016): 20150692.
Ma, Bing, et al. "Three metal-organic frameworks constructed from 3, 3 , 5, 5-azobenzene-tetracarboxylic acid: Synthesis, structure and luminescent sensing." Inorganica Chimica Acta 480 (2018): 166-172.
CN 202010149384.9 first office action.
PCT/CN2021/078885 international search report and written opinion.

\* cited by examiner

QUANTUM DOT LIGAND AND METHOD FOR PREPARING THE SAME, LIGHT EMITTING DEVICE AND METHOD FOR PREPARING THE SAME, AND DISPLAY DEVICE

CROSS-REFERENCE TO RELATED APPLICATION

This application is the U.S. national phase of PCT Application No. PCT/CN2021/078885 filed on Mar. 3, 2021, which claims a priority to Chinese Patent Application No. 202010149384.9 filed on Mar. 5, 2020, the disclosures of which are incorporated in their entirety by reference herein.

TECHNICAL FIELD

The present disclosure relates to the field of display technology, in particular, to a quantum dot ligand and a method for preparing the same, a light emitting device containing the quantum dot ligand and a method for preparing the same, and a display device containing the light emitting device.

BACKGROUND

Since quantum dots have the characteristics of adjustable emission spectra, narrow emission spectra and good light stability, quantum dot light emitting diodes have become a potential emerging display technology. However, due to the high surface atom ratio of quantum dots, most of the atoms are located on the surface of quantum dots. This leads to insufficient coordination of surface atoms and increased unsaturated bonds, and exists in the form of defect states. Moreover, these defect states have the ability to trap electrons or holes, thereby causing non-radiative transitions of exciton recombination. This reduces the luminous efficiency of the quantum dots, resulting in a reduction in the lifetime of the light emitting device.

SUMMARY

In one aspect, the present disclosure provides a quantum dot ligand, which is an azobenzene compound represented by the following structural formula (I):

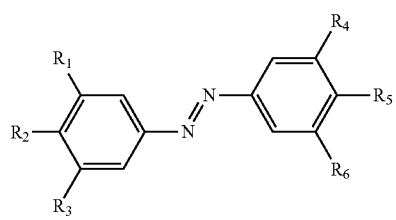

(I)

where $R_1$, $R_2$, $R_3$, $R_4$, $R_5$ and $R_6$ are independently —H, —$(CH_2)_n$SH, —$(CH_2)_m$COOH and —$(CH_2)$P$NH_2$; and at least one of $R_1$, $R_2$ and $R_3$ is —$(CH_2)_n$SH, —$(CH_2)_m$COOH or —$(CH_2)$P$NH_2$, and at least one of $R_4$, $R_5$ and $R_6$ is —$(CH_2)_n$SH, —$(CH_2)_m$COOH or —$(CH_2)$P$NH_2$, where n, m and p is independently an integer from 0 to 3.

Optionally, in the above formula (1), at least one of $R_1$, $R_2$ and $R_3$ is —SH, —COOH or —$NH_2$, and at least one of $R^4$, $R_5$ and $R_6$ is —SH, —COOH or —$NH_2$.

Optionally, in the above formula (1), $R_1$, $R_2$, $R_3$, $R^4$, $R_5$ and $R_6$ are —$(CH_2)_n$SH, respectively.

Optionally, in the above formula (1), $R_1$, $R_2$, $R_3$, $R_4$, $R_5$ and $R_6$ are —SH, respectively.

In another aspect, the present disclosure provides a method for preparing the above quantum ligand, including: reacting halogenated nitrobenzene, nitrobenzene carboxylic acid or p-phenylenediamine to generate mercaptoazobenzene, carboxyazobenzene, or aminoazobenzene, respectively.

Optionally, the method for preparing the quantum ligand includes: reducing the halogenated nitrobenzene in the presence of stannous chloride and concentrated hydrochloric acid to generate halogenated phenylamine; oxidizing the halogenated phenylamine in the presence of sodium perborate and boric acid to generate halogenated azobenzene; and reacting the halogenated azobenzene with potassium thiocarboxylate or thiocarboxylic acid in the presence of CuI and 1,10-phenanthroline to generate azobenzene thioester; and reacting the azobenzene thioester in the presence of $TiCl_4$ and Zn to generate mercaptoazobenzene.

Optionally, the method for preparing the quantum ligand includes: reacting the nitrobenzene carboxylic acid and its derivatives in the presence of D-glucose and sodium hydroxide to generate carboxyazobenzene.

Optionally, the method for preparing the quantum ligand includes: reacting p-phenylenediamine and its derivatives in the presence of potassium oxide to generate the aminoazobenzene.

In a yet aspect, the present disclosure provides a quantum dot material, including quantum dots and the above quantum dot ligand, in which at least one group on at least one benzene ring of the azobenzene compound is connected to the quantum dots through a coordination bond.

Optionally, at least one group on each benzene ring of one azobenzene molecule is connected to the quantum dots through the coordination bond, and groups on two different benzene rings of one azobenzene molecule are respectively connected to different quantum dots through the coordination bond.

In a yet aspect, the present disclosure provides a quantum dot light emitting device including a light emitting layer, the light emitting layer including quantum dots and the above quantum dot ligand, in which at least one group on each benzene ring of one azobenzene molecule is connected to the quantum dots through the coordination bond, and groups on two different benzene rings of one azobenzene molecule are respectively connected to different quantum dots through the coordination bond.

Optionally, each of the quantum dots is connected to the groups of at least two azobenzene molecules through the coordination bond.

Optionally, a plurality of the quantum dots is connected with each other through a plurality of azobenzene molecules to form a network structure.

Optionally, the quantum dot light emitting device further includes an anode, a hole injection layer, a hole transport layer, an electron transport layer, and a cathode.

In a yet aspect, the present disclosure provides a method for preparing a quantum dot light emitting device, including: coating a solution of the above quantum dot material; and subjecting the coated solution of the quantum dot material to form a light emitting layer, where at least one group on each benzene ring of one azobenzene molecule is connected to the quantum dots through the coordination bond, and groups on two different benzene rings of one azobenzene molecule are respectively connected to different quantum dots through the coordination bond.

Optionally, the method further includes: irradiating the solution of the quantum dot material with ultraviolet light before coating the solution of quantum dot material; and subjecting the coated solution of the quantum dot material to ultraviolet thermal annealing treatment after coating the solution of the quantum dot material to form the light emitting layer.

Optionally, the method further includes: sequentially forming an anode, a hole injection layer, and a hole transport layer, and forming the light emitting layer on the hole transport layer; and sequentially forming an electron transport layer and a cathode on the light emitting layer.

Optionally, the method further includes: sequentially forming a cathode and an electron transport layer, and forming the light emitting layer on the electron transport layer; and sequentially forming a hole transport layer, a hole injection layer and an anode on the light emitting layer.

In a yet aspect, the present disclosure provides a display device including the above quantum dot light emitting device.

The advantageous effects of the above technical solutions of the present disclosure are shown as follows.

The quantum dot ligand according to the present disclosure is an azobenzene compound with a specific structure, and groups on the benzene ring of the azobenzene compound can be connected to the quantum dot through a coordination bond, thereby forming a network or chain structure. This avoids the problem of insufficient coordination of atoms on the surface of quantum dots, and reduces unsaturated bonds, thereby reducing surface defects of quantum dots. Moreover, the azobenzene compound has carrier transport properties, which improves the carrier transporting rate between quantum dots, thereby improving the luminous efficiency of the quantum dots and prolonging the life of the light emitting device.

DETAILED DESCRIPTION

Figure 1:
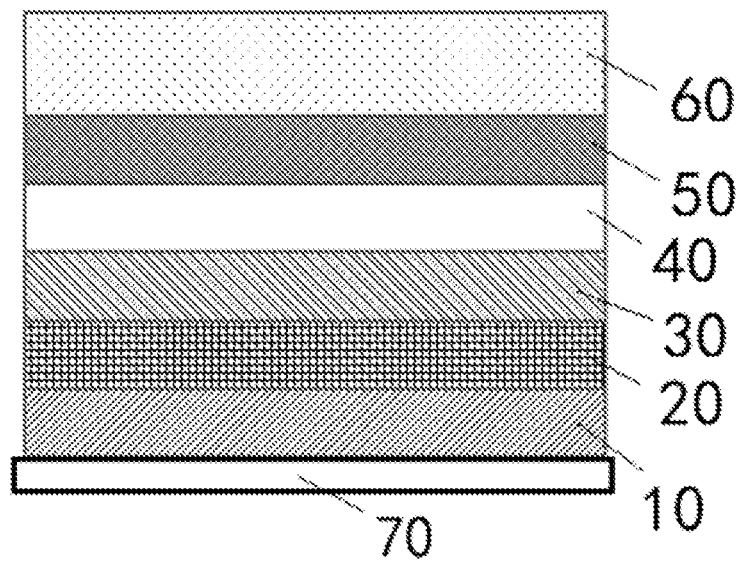
FIG. 1 is a schematic view showing a quantum dot light emitting device according to one embodiment of the present disclosure.

In order to illustrate the purposes, technical solution and advantages in the embodiments of the present disclosure in a clearer manner, the technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on the described embodiments of the present disclosure, a person skilled in the art may obtain the other embodiments, which also fall within the scope of the present disclosure.

In view of the problems in the prior art, the present disclosure provides a quantum dot ligand and a method for preparing the same, a light emitting device prepared from the quantum dot ligand and a method for preparing the same, and a display device containing the light emitting device, which solves the problems of insufficient coordination of atoms on the surface of quantum dots and defects on the surface of quantum dots, thereby solving the problem of reduced luminous efficiency of quantum dots.

An embodiment according to the present disclosure provides quantum dot ligand, which is an azobenzene compound represented by the following structural formula (I):

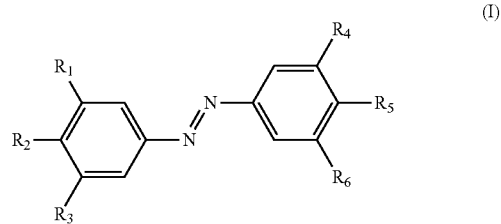

where $R_1$, $R_2$, $R_3$, $R_4$, $R_5$ and $R_6$ are independently —H, —(CH$_2$)$_n$SH, —(CH$_2$)$_m$COOH and —(CH$_2$)PNH$_2$; and at least one of $R_1$, $R_2$ and $R_3$ is —(CH$_2$)$_n$SH, —(CH$_2$)$_m$COOH or —(CH$_2$)PNH$_2$, and at least one of $R_4$, $R_5$ and $R_6$ is —(CH$_2$)$_n$SH, —(CH$_2$)$_m$COOH or —(CH$_2$)PNH$_2$, where n, m and p is independently an integer from 0 to 3. Optionally, n, m, and p may independently be integers of 0, 1, 2, or 3.

The quantum dot ligand according to the embodiment of the present disclosure is an azobenzene compound with a specific structure, and each benzene ring of the azobenzene compound has at least one group, and a coordination bond can be formed between the group and the quantum dots. Optionally, the group on the benzene ring of the azobenzene compound may be a mercapto group, a carboxy group or an amino group. For example, the group may be a mercapto group. Optionally, each benzene ring of the azobenzene compound may have a plurality of groups, for example, it may have at most three groups, so as to increase the rate of the modification of surface defects of quantum dots by groups in the azobenzene compound. The groups on the benzene ring of the azobenzene compound can be connected to the quantum dots through a coordination bond, so that the quantum dot ligand and the quantum dot can be connected through a coordination bond, thereby readily forming a network or chain structure. This avoids the problem of insufficient coordination of atoms on the surface of quantum dots and reduces unsaturated bonds, thereby reducing surface defects of quantum dots. Moreover, the azobenzene compound has carrier transport properties, which improves the carrier transporting rate between quantum dots, thereby improving the luminous efficiency of the quantum dots.

Optionally, the groups $R_1$, $R_2$, $R_3$, $R_4$, $R_5$ and $R_6$ can independently be a mercapto group —$(CH_2)_n SH$, a carboxy group —$(CH_2)_m COOH$ and an amino —$(CH_2)p NH_2$ containing 0 to 3 carbon atoms (that is, n, m, and p are 0 to 3). Optionally, the groups $R_1$, $R_2$, $R_3$, $R^4$, $R_5$ and $R_6$ can independently be a mercapto group —$(CH_2)_n SH$, a carboxy group —$(CH_2)_m COOH$ and an amino group —$(CH_2)P NH_2$ containing 1, 2 or 3 carbon atoms. Optionally, the groups $R_1$, $R_2$, $R_3$, $R_4$, $R_5$ and $R_6$ may independently be —SH, —COOH or —$NH_2$ (that is, n, m and p are 0). Optionally, at least one of $R_1$, $R_2$ and $R_3$ is —SH, —COOH or —$NH_2$, and at least one of $R_4$, $R_5$ and $R_6$ is —SH, —COOH or —$NH_2$. By having at least one such group on each benzene ring, the quantum dots can readily form a network or chain structure, which avoids the problem of insufficient coordination of the atoms on the surface of the quantum dots.

Optionally, each benzene ring of the azobenzene compound has at least one mercapto group. Optionally, the groups $R_1$, $R_2$, $R_3$, $R_4$, $R_5$ and $R_6$ are —$(CH_2)_n SH$, respectively. Optionally, the groups $R_1$, $R_2$, $R_3$, $R_4$, $R_5$ and $R_6$ are —SH, respectively. In the above embodiment, the groups $R_1$ to $R_6$ are all mercapto groups, so each benzene ring has three mercapto groups. The positions of the three mercapto groups on each benzene ring are the same, so that the mercapto groups on the mercapto azobenzene compound are symmetrical, which facilitates the connection of the quantum dots through the mercapto groups. The mercapto group and the quantum dot can form a coordinate bond connection, which is beneficial to form a network or chain structure. This avoids insufficient coordination of atoms on the surface of the quantum dots, and can improve the rate of modification of the surface defects of the quantum dots.

Another embodiment of the present disclosure provides a method for preparing the above quantum ligand, including: reacting halogenated nitrobenzene, nitrobenzene carboxylic acid or p-phenylenediamine to generate mercaptoazobenzene, carboxyazobenzene, or aminoazobenzene, respectively. Optionally, the method for preparing a quantum ligand includes: reducing the halogenated nitrobenzene in the presence of stannous chloride and concentrated hydrochloric acid to generate halogenated phenylamine; oxidizing the halogenated phenylamine in the presence of sodium perborate and boric acid to generate halogenated azobenzene; reacting the halogenated azobenzene with potassium thiocarboxylate or thiocarboxylic acid in the presence of CuI and 1,10-phenanthroline to generate azobenzene thioester; and finally reacting the azobenzene thioester in the presence of $TiCl_4$ and Zn to generate mercaptoazobenzene. Optionally, the method for preparing the quantum ligand includes: reacting the nitrobenzene carboxylic acid (e.g., benzoic acid) and its derivatives in the presence of D-glucose and sodium hydroxide to generate carboxyazobenzene. The number of carboxy groups in carboxyazobenzene depends on the number of carboxy groups in nitrobenzoic acid and its derivatives. Optionally, the method for preparing the quantum ligand includes: reacting p-phenylenediamine and its derivatives in the presence of potassium oxide to generate the aminoazobenzene. The number of amino groups in aminoazobenzene depends on the number of amino groups in aminoazobenzene and its derivatives.

In the method according to the embodiment of the present disclosure, the nitrobenzene is reduced to phenylamine under the catalytic reduction effect of stannous chloride and concentrated hydrochloric acid. The halogenated nitrobenzene used may optionally be iodonitrobenzene. According to the number of substituents on each benzene ring of the azobenzene prepared, a halogenated nitrobenzene corresponding to the number of halogen atoms on the benzene ring can be selected. The halogenated phenylamine is oxidized under the catalytic effect of sodium perborate and boric acid to generate a halogenated azobenzene. The halogenated azobenzene is reacted with potassium thiocarboxylate or thiocarboxylic acid in the presence of CuI and 1,10-phenanthroline to generate azobenzene thioester. Finally, the azobenzene thioester is reacted in the presence of $TiCl_4$ and Zn to generate mercaptoazobenzene.

Figure 3:
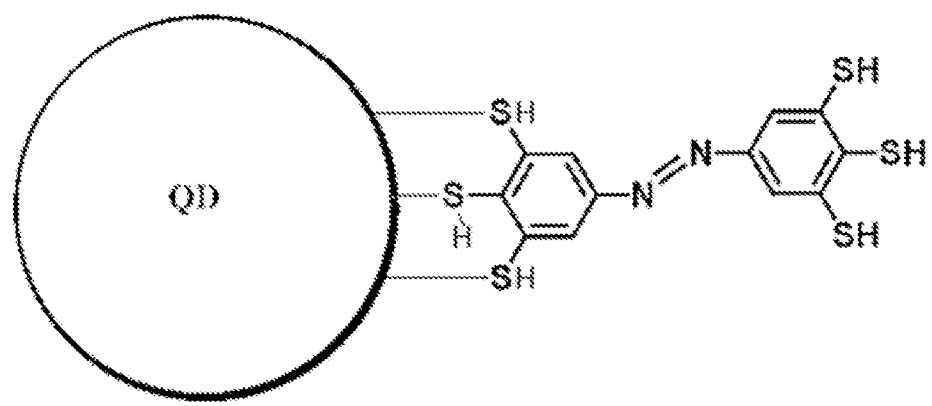
FIG. 3 is a schematic view showing that the quantum dot is connected to the mercapto group in the mercaptoazobenzene compound according to an embodiment of the present disclosure.

An embodiment of the present disclosure provides a quantum dot material quantum dot material, including quantum dots and the quantum dot ligand of the above embodiment, in which at least one group on at least one benzene ring of the azobenzene compound is connected to the quantum dots through a coordination bond. As shown in FIG. 3, the azobenzene compound is a mercaptoazobenzene compound, and at least one mercapto group on at least one benzene ring of the mercaptoazobenzene compound is connected to the quantum dots by a coordination bond, where QD represents the quantum points. Optionally, the quantum dots are commonly used quantum dots in the field of light emitting devices, for example, binary or ternary quantum dots, such as CdS, CdSe, ZnSe, InP, PbS, $CsPbCl_3$, $CsPbBr_3$, $CsPhI_3$, CdS/ZnS, CdSe/ZnS, ZnSe, InP/ZnS, PbS/ZnS, $CsPbCl_3$/ZnS, $CsPbBr_3$/ZnS, $CsPhI_3$/ZnS or the composite quantum dots, or may be quantum dots with a core-shell structure. In these embodiments, the group and the quantum dot form a coordinate bond connection, which reduces the lack of coordination of atoms on the surfaces of the quantum dots, and reduces the defects on the surfaces of the quantum dots.

Optionally, at least one group on each benzene ring of one azobenzene molecule is connected to the quantum dots through a coordination bond, and groups on two different benzene rings of one azobenzene molecule are respectively connected to different quantum dots through a coordination bond. In these embodiments, the ligand and the quantum dots form a network or chain structure, which can increase the carrier transporting rate between the quantum dots and increase the luminous efficiency of the quantum dots. In addition, the light emitting layer formed by the quantum dot material in the present disclosure not only has high luminous efficiency, but also has good stability and long life.

In the preparation process of quantum dot materials, in order to prevent oxidation, it needs to be carried out under inert environmental protection (for example, nitrogen protection), and anhydrous and oxygen-free ultra-dry solvents can be used. The quantum dots can be cleaned and dispersed, and then the quantum dots and the quantum dot ligands are mixed and reacted for a period of time, so that the quantum dots and the groups (for example, mercapto groups) in the quantum dot ligands are connected through a coordination bond. After the reaction for a period of time, the quantum dot material can be obtained through process treatments such as sedimentation, centrifugation, washing and separation. For example, when the quantum dot ligand is a mercaptoazobenzene compound, the common quantum dot solvent can be removed by a rotary evaporator, and the quantum dot solution can be re-dispersed with 5 mL chloroform, and then added to a 20 mL reflux bottle equipped with magnetic stirring. The temperature is raised to 65° C., the chloroform solution of the quantum dot ligand is slowly added dropwise to the quantum dot solution 3 times with an interval of 1 hour, and finally refluxed for 1 hour to stop the reaction and cool to room temperature; then an appropriate amount of acetone is added to the reaction system, the quantum dots are centrifuged after being settled, the precipitate can be dissolved in toluene, and then treated with acetone/toluene cycle 3 times to wash the residual oleic acid and unmodified quantum dot ligands on the surface of the quantum dots, thereby preparing the quantum dot material of the present disclosure.

An embodiment of the present disclosure also provides a quantum dot light emitting device. As shown in FIG. 1, the quantum dot light emitting device includes a light emitting layer 40, the light emitting layer 40 including quantum dots and the quantum dot ligand according to the embodiment of the present disclosure. At least one group on each benzene ring of one azobenzene molecule is connected to the quantum dots through a coordination bond, and groups on two different benzene rings of one azobenzene molecule are respectively connected to different quantum dots through a coordination bond. The quantum dot ligand structure may optionally be the quantum dot ligand structure in the above embodiment, for example, the group may include at least one of a mercapto group, a carboxy group, or an amino group.

In the quantum dot light emitting device according to the embodiment of the present disclosure, at least one group on each benzene ring of the azobenzene compound is connected to the quantum dot through a coordinate bond, for example, the S atom in at least one mercapto group on each benzene ring of the mercaptoazobenzene compound is connected to the quantum dot through a coordinate bond. This reduces the defects on the surfaces of the quantum dots. In addition, the mercapto groups on two different benzene rings of one mercaptoazobenzene molecule are respectively connected to different quantum dots through a coordination bond. For example, the mercapto group on one benzene ring of the first mercaptoazobenzene molecule is connected to the first quantum dot through a coordination bond, and the mercapto group on the other benzene ring of the first mercaptoazobenzene molecule is connected to the second quantum dot through a coordination bond. The first quantum dot can also be connected to the mercapto group on a benzene ring in the second mercaptoazobenzene molecule through a coordination bond, and the second quantum dot can also be connected to the mercapto group on a benzene ring in the third mercaptoazobenzene molecule through a coordinate bond. Different quantum dots are connected to form a chain or network structure through the mercaptoazobenzene compound, which avoids insufficient coordination of atoms on the surfaces of the quantum dots, reduces the defects on the surfaces of the quantum dots, and improves the interface of the light emitting layer. Thus, the light emitting device according to the present disclosure can increase the carrier transporting rate between quantum dots, increase the luminous efficiency of the device, and reduce the turn-on voltage of a device, so that the light emitting device has good stability and long life.

In some embodiments of the present disclosure, each of the quantum dots is connected to the groups of at least two azobenzene molecules through a coordination bond, and the group and the quantum dot can form a coordination bond connection, which is readily to form a chain or network structure. A plurality of quantum dots can be connected by a plurality of azobenzene compounds to form a network structure, thereby reducing the lack of coordination of atoms on the surface of quantum dots, reducing defects on the surface of quantum dots, and increasing the carrier transporting rate between quantum dots, and improving the luminous efficiency of quantum dots.

Figure 2:
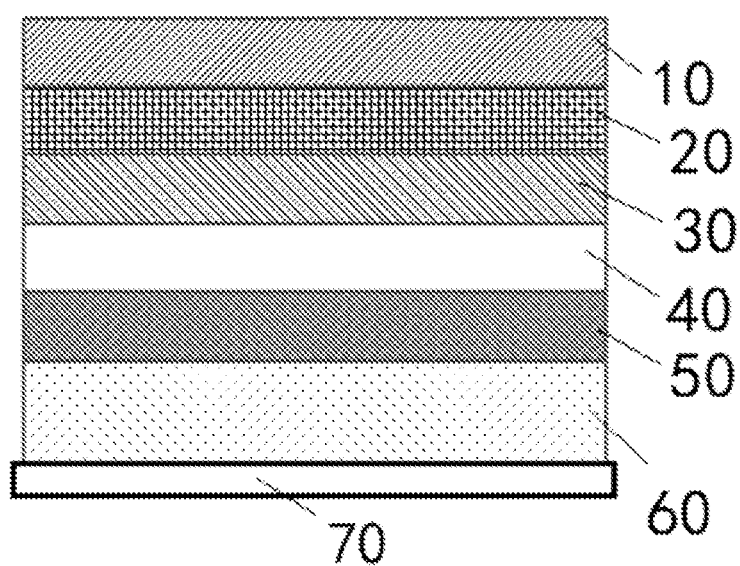
FIG. 2 is a schematic view showing a quantum dot light emitting device according to another embodiment of the present disclosure.

According to some embodiments of the present disclosure, as shown in FIGS. 1 and 2, the quantum dot light emitting device may further include an anode 10, a hole injection layer 20, a hole transport layer 30, an electron transport layer 50 and a cathode 60. The anode 10, the hole injection layer 20, the hole transport layer 30, the light emitting layer 40, the electron transport layer 50, and the cathode 60 are stacked in this order. That is, the hole injection layer 20 is directly arranged on the anode 10, the hole transport layer 30 is directly arranged on the hole injection layer 20, the light emitting layer 40 is directly arranged on the hole transport layer 30, and the electron transport layer 50 is directly arranged on the light emitting layer 40, and the cathode 60 is directly arranged on the electron transport layer 50. In addition, the quantum dot light emitting device may further include a substrate 70. As shown in FIG. 1, the anode 10, the hole injection layer 20, the hole transport layer 30, the light emitting layer 40, the electron transport layer 50 and the cathode 60 can be sequentially stacked on the substrate 70 in a direction away from the substrate 70. As shown in FIG. 2, the cathode 60, the electron transport layer 50, the light emitting layer 40, the hole transport layer 30, the hole injection layer 20 and the anode 10 can also be sequentially stacked on the substrate 70 in a direction away from the substrate 70.

The anode 10 may be made of indium tin oxide (ITO). The hole injection layer 20 may be made of PEDOT (polymer of 3,4-ethylenedioxythiophene monomer):PSS (polystyrene sulfonate) hole injection material. The hole transport layer 30 can be made of poly((9,9-dioctylfluorene-2,7-diyl)-co-(4,4'-(N-(4-sec-butylphenyl) diphenylamine)) (TFB) material. The electron transport layer 50 may be made of ZnO nanoparticles or ZnMgO materials, and the electron transport layer 50 may be formed by spin-coating ZnO nanoparticles. The cathode 60 may be made of Al or Mg/Ag material, and the cathode 60 may be formed by evaporation.

An embodiment of the present disclosure provides a method for preparing a quantum dot light emitting device, including: coating a solution of the quantum dot material according to the above embodiment; and subjecting the coated solution of the quantum dot material to form a light emitting layer, where at least one group (e.g., mercapto group) on each benzene ring of one azobenzene molecule is connected to the quantum dots through a coordination bond, and groups on two different benzene rings of one azobenzene molecule are respectively connected to different quantum dots through a coordination bond.

In the quantum dot light emitting device prepared by the method according the above embodiment, at least one group on each benzene ring of the azobenzene compound is connected to the quantum dot through a coordination bond, which reduces the lack of coordination of atoms on the surfaces of the quantum dots, and reduces the defects on the surfaces of the quantum dots. Moreover, the quantum dots can self-assemble along the long axis of the azobenzene compound molecule to form a network structure or a chain structure. This can also increase the carrier transporting rate between quantum dots and improve the luminous efficiency of quantum dots. Therefore, the light emitting layer prepared from the quantum dots has high luminous efficiency, good stability and long life.

Optionally, each of the quantum dots is connected to the groups of at least two azobenzene molecules through a coordination bond. Further optionally, a plurality of the quantum dots is connected through a plurality of the azobenzene molecules to form a network structure.

Figure 4:
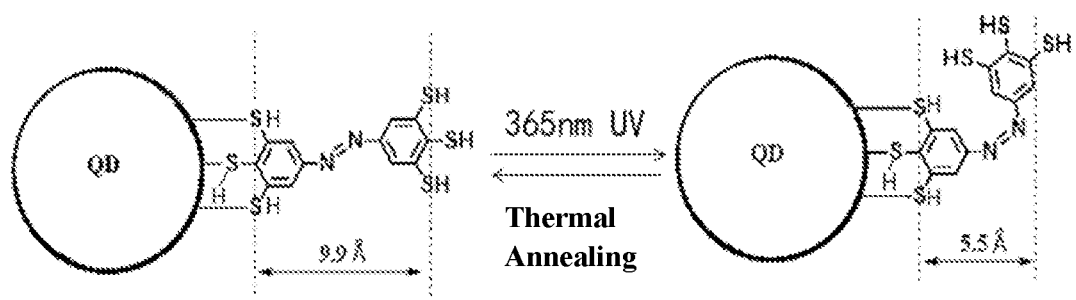
FIG. 4 is a schematic view showing that the quantum dot is connected to the mercapto group in the mercaptoazobenzene compound during ultraviolet and thermal annealing treatment according to an embodiment of the present disclosure.
Figure 5:
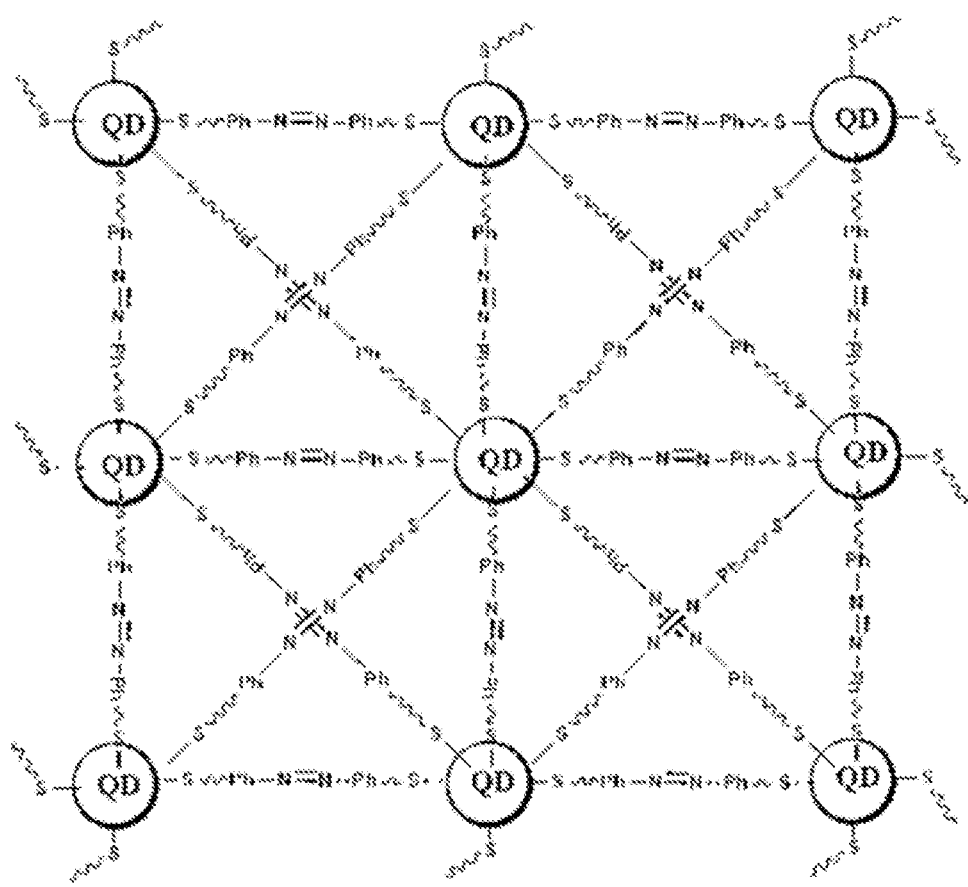
FIG. 5 is a schematic view showing network structure formed between quantum dots and the mercaptoazobenzene compound according to an embodiment of the present disclosure.

Optionally, the method for preparing the quantum dot light emitting device further includes: irradiating the solution of the quantum dot material with ultraviolet light before coating the solution of the quantum dot material; and subjecting the coated solution of the quantum dot material to ultraviolet thermal annealing treatment after coating the solution of the quantum dot material to form the light emitting layer. Before coating (e.g., spin coating) the solution of quantum dot material, the solution of quantum dot material can be irradiated with ultraviolet light (UV) with a wavelength of 365 nm. As shown in FIG. 4, the quantum dot ligand is a mercaptoazobenzene compound. The solution of quantum dot material is irradiated with ultraviolet light (UV) with a wavelength of 365 nm, the mercaptoazobenzene compound ligand on the surface of the quantum dot is converted into a cis structure, whereby the mercaptoazobenzene compound molecules shrink in the lateral distance, which is equivalent to the volume shrinkage of the quantum dots on the entire surfaces of the quantum dots. QD stands for quantum dots. After coating (such as spin coating) the solution of the quantum dot material, the coated solution of the quantum dot material is subjected to ultraviolet thermal annealing treatment so that the mercaptoazobenzene compound is converted into a normally stable trans structure. The mercaptoazobenzene compound molecule extends laterally, and the mercaptoazobenzene compound on the surfaces of the quantum dots expands. The uncoordinated mercapto group at the other end of the mercaptoazobenzene compound will extend to the surrounding quantum dots to form new coordination points together with the surrounding quantum dots, thereby connecting the surrounding quantum dots together. For example, a network structure can be formed in the form of QD-S-azobenzene-S-QD, for example, a network structure as shown in FIG. 5. In FIG. 5, QD represents a quantum dot, Ph represents a benzene ring, and the H atom connected to the S atom is not shown. Due to the conjugated structure of mercaptoazobenzene compounds, its carrier transport characteristics are better than those of alkyl chain ligands, and due to the bridging effect of double-terminal mercaptoazobenzene compounds, it can effectively improve the carrier transporting rate between QDs.

In another embodiment of the present disclosure, the method for preparing the quantum dot light emitting device further includes: sequentially forming an anode 10, a hole injection layer 20, and a hole transport layer 30, and forming a light emitting layer 40 on the hole transport layer 30; and sequentially forming an electron transport layer 50 and a cathode 60 on the light emitting layer 40. That is, in the process of preparing the quantum dot light emitting device, the anode 10, the hole injection layer 20, and the hole transport layer 30 may be sequentially formed; the light emitting layer 40 is formed on the hole transport layer 30; the electron transport layer 50 and cathode 60 are sequentially formed on the light emitting layer 40. The quantum dot light emitting device can also be prepared by another method, for example, the cathode 60, the electron transport layer 50, and the light emitting layer 40 are sequentially formed, and the hole transport layer 30, the hole injection layer 20 and anode 10 are sequentially formed on the light emitting layer 40. In the process of preparing the quantum dot light emitting device, a suitable preparation method can be selected according to the actual situation.

The quantum dot light emitting device may further include a substrate 70. As shown in FIG. 1, during the preparation process, the anode 10, the hole injection layer 20, the hole transport layer 30, the light emitting layer 40, the electron transport layer 50 and the cathode 60 can be sequentially stacked on the substrate 70 in a direction away from the substrate 70. As shown in FIG. 2, the cathode 60, the electron transport layer 50, the light emitting layer 40, the hole transport layer 30, the hole injection layer 20 and the anode 10 can also be sequentially stacked on the substrate 70 in a direction away from the substrate 70. The anode 10, the hole injection layer 20, the hole transport layer 30, the electron transport layer 50 and the cathode 60 can be prepared using common materials by conventional methods. For example, they can be prepared by the materials and methods described above, which will not be repeated herein.

In some embodiments, the substrate can be cleaned by ultrasound with absolute ethanol and deionized water. After the anode 10 is formed on the substrate, the anode 10 can be cleaned ultrasonically with absolute ethanol and deionized water. For example, after being cleaned for 15 minutes, the anode 10 is dried, and then irradiated with an ultraviolet lamp for 10 minutes. The above treatment can improve the surface work function of the anode 10. A hole injection material (e.g., PEDOT) is spin-coated on the anode 10 to form a hole injection layer 20. After the hole injection layer 20 is formed, the surface morphology of the hole injection layer 20 can be improved by heat annealing treatment, and the interface barrier between the anode 10 and the hole transport layer 30 can be reduced. The hole transport layer material (e.g., TFB) can be spin-coated on the hole injection layer 20 by a solution method to form the hole transport layer 30, and thermal annealing is performed. Then, a light emitting layer 40 is formed on the hole transport layer 30. The step of forming the light emitting layer 40 may include: spin-coating a solution of quantum dot material on the hole transport layer 30, where the quantum dot material is the quantum dot material described in the above embodiment; and subjecting the spin-coated solution of quantum dot material to form the light emitting layer 40. In the light emitting layer 40 thus formed, at least one group (e.g., a mercapto group) on each benzene ring of one azobenzene molecule is connected to the quantum dots through a coordination bond, and groups on two different benzene rings of one azobenzene molecule are respectively connected to different quantum dots through a coordination bond. The electron transport layer 50 and the cathode 60 are sequentially formed on the light emitting layer 40. The electron transport material (e.g., ZnO) can be spin-coated by a solution method to form the electron transport layer 50, and the cathode Al can be formed on the electron transport layer 50 by vacuum evaporation.

Figure 6:
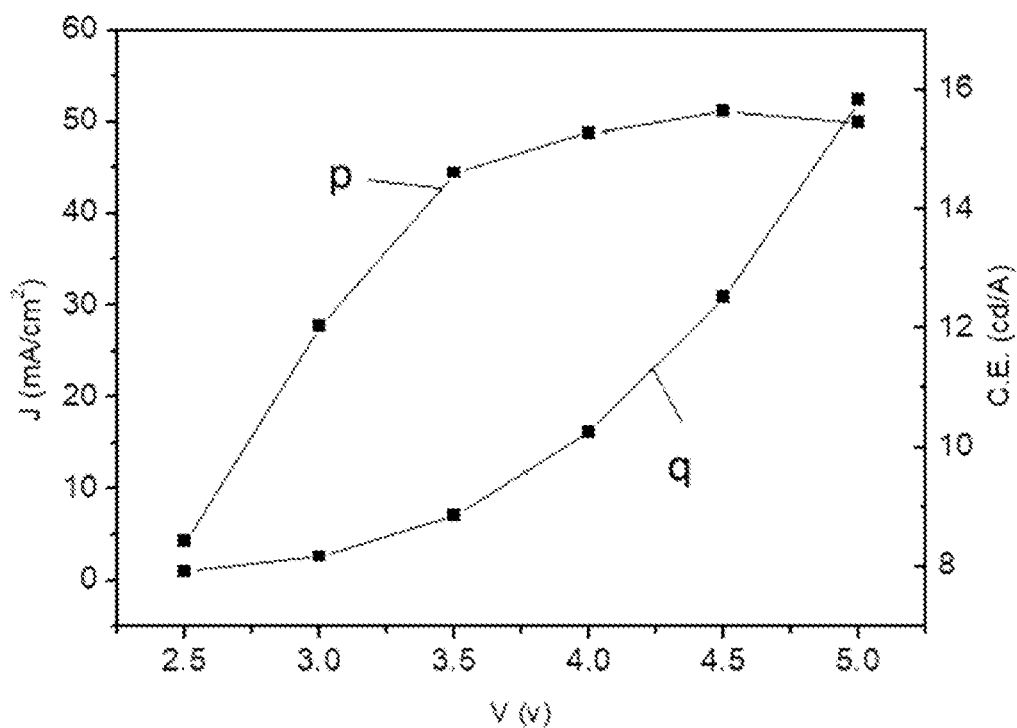
FIG. 6 is a schematic view showing the current density and current efficiency of the light emitting device according to the present disclosure under different voltages.
Figure 7:
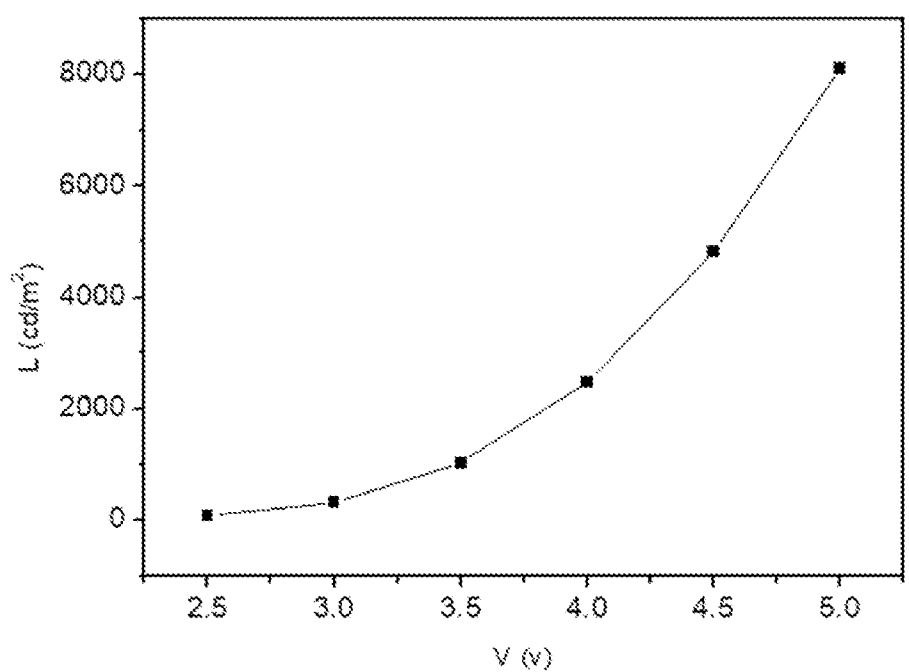
FIG. 7 is a schematic view showing the brightness of the light emitting device according to the present disclosure under different voltages.

The performance test of the quantum dot light emitting device of the present disclosure prepared by the above method is shown in FIG. 6 and FIG. 7, where the quantum ligand is an azobenzene compound represented by formula (I), in which the groups $R_1$, $R_2$, $R_3$, $R_4$, $R_5$ and $R_6$ are all —SH. FIG. 6 is a schematic view showing the current density and current efficiency of the light emitting device according to the present disclosure under different voltages. FIG. 7 is a schematic view showing the brightness of the light emitting device according to the present disclosure under different voltages. The curve p in FIG. 6 represents the current efficiency, and the curve q represents the current density. When the voltage rises from 2.5V to 3.5V, the current efficiency increases rapidly, and the current density increases slowly. When the voltage rises from 3.5V to 5.0V, the current efficiency increases slowly and the current density increases rapidly. As shown in FIG. 7, when the voltage rises from 2.5V to 3.5V, the brightness of the light increases slowly. When the voltage rises from 3.5V to 5.0V, the brightness of the light increases rapidly. In practical applications, a suitable operating voltage can be selected according to actual needs, to obtain the desired performance. For example, the voltage can be selected between 4.0V and 5.0V, which can have higher current density, current efficiency, and luminous brightness.

An embodiment of the present disclosure also provide a display device, including the quantum dot light emitting device as described in the above embodiments. The display device with the quantum dot light emitting device in the above embodiment has high luminous efficiency and good stability, thereby improving the luminous efficiency and lifetime of the display device.

In order to more fully describe the technical solution of the present disclosure, the method for preparing the mercaptoazobenzene compound is taken as an example to describe the method for preparing the quantum dot ligand of the present disclosure.

According to an embodiment of the present disclosure, there is provided a method for preparing a mercaptoazobenzene compound, including: reacting a halogenated azobenzene compound with a thioacetate or thioacetic acid to generate an azobenzene compound with thioacetate group; and hydrolyzing the azobenzene compound with a thioacetate group to generate a mercaptoazobenzene compound. Each benzene ring of the halogenated azobenzene compound contains at least one halogen atom, and each benzene ring of the thioacetate group containing azobenzene compound contains at least one thioacetate group. Each benzene ring of the mercaptoazobenzene compound contains at least one mercapto group.

The method for preparing the mercaptoazobenzene compound further includes preparing a halogenated azobenzene compound, which includes: reducing a nitrobenzene compound containing a halogen element on a benzene ring to generate a phenylamine compound containing a halogen element on the benzene ring; and subjecting the phenylamine compound containing halogen element on the benzene ring to a coupling reaction to prepare the halogenated azobenzene compound.

The preparation of a specific mercapto azobenzene compound, that is, hexadentate mercapto azobenzene, is described below through more detailed specific examples.

The structure of hexadentate mercaptoazobenzene is shown in the following formula (II):

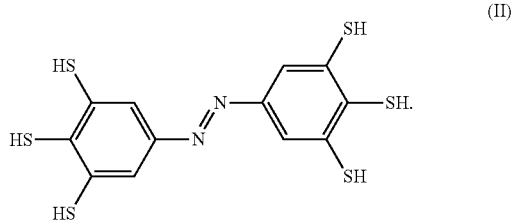 [SMILES: Sc1cc(/N=N/c2cc(S)c(S)c(S)c2)cc(S)c1S]

(II)

The synthesis method of hexadentate mercaptoazobenzene can be shown by the following formula (a):

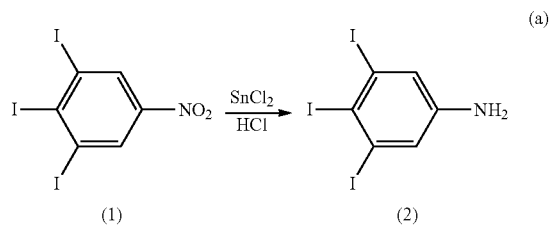

(a)

The phenylamine compound containing a halogen element (2) is prepared from nitrobenzene compound containing a halogen element (1) through the reaction (a). The specific process includes: dissolving 70 mmol of compound (1) in 500 mL of anhydrous acetone, heating to reflux temperature, and slowly adding dropwise 280 mmol of suspension of stannous chloride dihydrate ($SnCl_2$) in 350 mL of a concentrated hydrochloric acid (HCl), where the dropwise adding and the reaction last for 2 hours. The specific reaction process can be as shown in reaction (a). After the reaction is completed, an ice-water mixture is added to the reaction solution to cool down, and NaOH aqueous solution is added dropwise to adjust to make the pH greater than 11; ether is used to extract 3 times, the organic layers are combined, saturated NaCl solution and deionized water are used to wash 3 times, and anhydrous $MgSO_4$ is added to dry and concentrate; a silica gel column is used for purification, where the eluent is n-hexane and ether (the ratio of n-hexane:ether is 1:1), to obtain the target compound (2). The yield of the target compound (2) was 89%, and the target compound (2) has 1H NMR (400 MHz): $\delta=6.41$ (s, 2H).

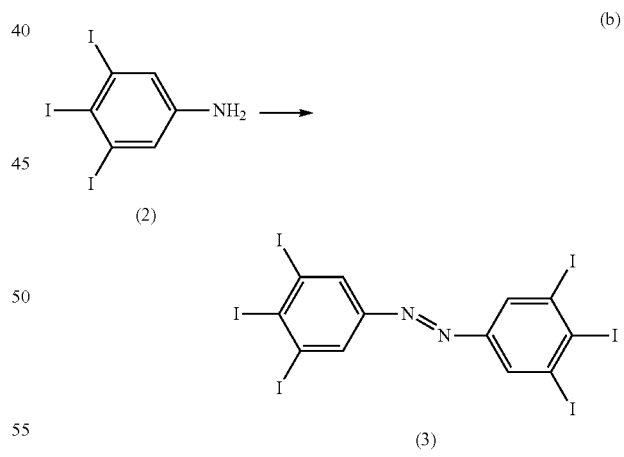

(b)

The halogenated azobenzene compound (3) is prepared from the phenylamine compound containing a halogen element (2) through the reaction (b). The specific process includes: dissolving 60 mmol of compound (2) in 200 mL of acetic acid, then adding 80 mmol of sodium perborate and 50 mmol of boric acid, heating to 60° C. and reacting for 6 hours, where the reaction solution turns dark red and the specific reaction process can be as shown in reaction (b); after the reaction, a large amount of ice water is added, and a large amount of red-brown solids precipitate out; the solids are collected by filtration, and the red-brown solids are dissolved in dichloromethane and washed with deionized water three times, in which the inorganic salt is removed; dried and concentrated by adding anhydrous $MgSO_4$, recrystallized and purified in a refrigerator, to obtain the target compound (3). The yield of the target compound (3) is 85%, and the target compound (3) has 1H NMR (400 MHz): δ=7.68 (d, J=9 Hz, 4H).

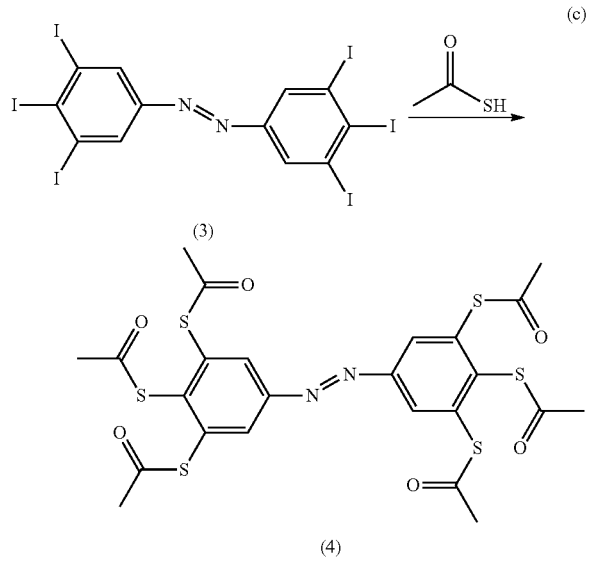

(c)

(3)

(4)

The azobenzene compound having a thioacetate group (4) is prepared from the halogenated azobenzene compound (3) through the reaction (c), and the reaction (c) is carried out under the protection of nitrogen. The specific process includes: taking 0.5 mmol of compound (3), 60 mmol of CuI, 120 mmol of 1,10-phenanthroline and 5 mmol of potassium thioacetate or thioacetic acid into a 50 mL round bottom flask, then adding 20 mL of dry toluene, heating to 100° C. and reacting under the stirring for 24 hours, the specific reaction process can be as shown in reaction (c); cooling the reacted mixture to room temperature, adding 20 mL of ether and 20 mL of deionized water, stirring to mix and separating the organic layer, which is extracted twice with ether, and the organic layers are combined, dried over anhydrous $MgSO_4$ and concentrated. The target compound (4) is obtained by recrystallization and purification in the refrigerator, and the yield of the target compound (4) is 71%. The target compound (4) has 1H NMR (400 MHz): δ=7.41 (d, J=9 Hz, 4H), 2.42 (s, 18H).

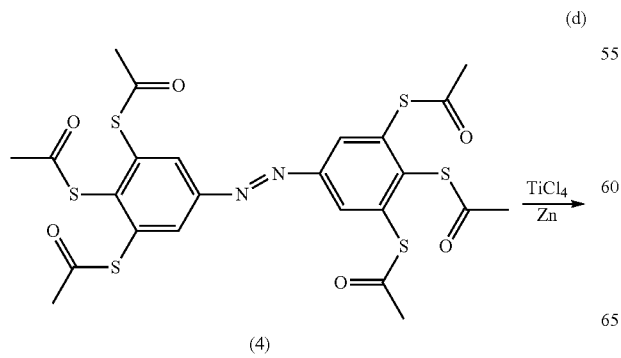

(d)

(4)

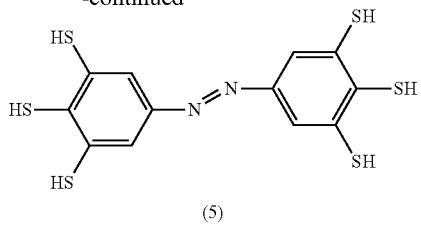

(5)

The hexadentate mercaptoazobenzene compound (5) is prepared from the azobenzene compound having a thioacetate group (4) through the reaction (d). The specific process includes: adding 1.5 mmol of titanium tetrachloride ($TiCl_4$) and 3 mmol of zinc (Zn) to 25 mL of dichloromethane, cooling to 0° C., stirring for 30 minutes, and then adding 0.74 mmol of compound (4), continuing the reaction for 10 minutes when the reaction system was slowly raised to room temperature, quickly adding 20 mL of deionized water, and then extracting three times with dichloromethane, combining the organic layers, which is dried and concentrated with anhydrous $MgSO_4$, and then recrystallized and purified in the refrigerator to obtain the target compound (5), hexadentate mercaptoazobenzene. The yield of the target compound (5) is 85%, and the target compound (5) has 1H NMR (400 MHz): δ=6.71 (d, J=9 Hz, 4H).

The light emitting device prepared from the target compound (i.e., hexadentate mercaptoazobenzene) prepared in the above embodiment has excellent current density, current efficiency, and luminous brightness, as shown in FIGS. 6 and 7 in detail.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

The above description is alternative embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A quantum dot ligand, which is an azobenzene compound represented by the following structural formula (I):

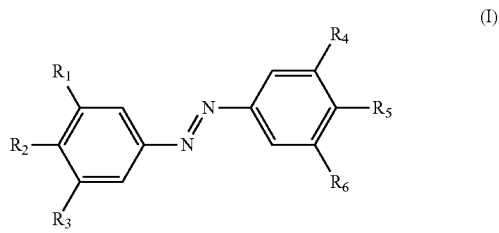

(I)

wherein $R_1$, $R_2$, $R_3$, $R_4$, $R_5$ and $R_6$ are independently —H, —$(CH_2)_n$SH or —$(CH_2)_p$NH$_2$; and at least one of $R_1$, $R_2$ and $R_3$ is —$(CH_2)_n$SH or —$(CH_2)_p$NH$_2$, and at least one of $R_4$, $R_5$ and $R_6$ is —$(CH_2)_n$SH or —$(CH_2)_p$NH$_2$, wherein n, m and p is independently an integer from 0 to 3.

2. The quantum dot ligand of claim 1, wherein at least one of $R_1$, $R_2$ and $R_3$ is —SH or —NH$_2$, and at least one of $R_4$, $R_5$ and $R_6$ is —SH or —NH$_2$.

3. The quantum dot ligand of claim 1, wherein $R_1$, $R_2$, $R_3$, $R_4$, $R_5$ and $R_6$ are all —$(CH_2)_n$SH.

4. The quantum dot ligand of claim 2, wherein $R_1$, $R_2$, $R_3$, $R_4$, $R_5$ and $R_6$ are all —SH.

5. A method for preparing a quantum ligand, which is an azobenzene compound represented by the following structural formula (I):

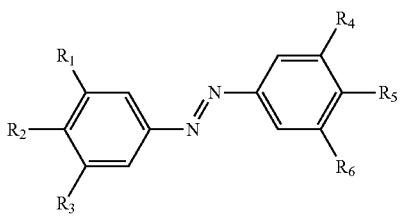

wherein $R_1$, $R_2$, $R_3$, $R_4$, $R_5$ and $R_6$ are independently —H, —$(CH_2)_n$SH, —$(CH_2)_m$COOH or —$(CH_2)_p$NH$_2$; and at least one of $R_1$, $R_2$ and $R_3$ is —$(CH_2)_n$SH, —$(CH_2)_m$COOH or —$(CH_2)_p$NH$_2$, and at least one of $R_4$, $R_5$ and $R_6$ is —$(CH_2)_n$SH, —$(CH_2)_m$COOH or —$(CH_2)_p$NH$_2$, wherein n, m and p is independently an integer from 0 to 3, the method comprising:

reacting halogenated nitrobenzene, nitrobenzene carboxylic acid or p-phenylenediamine, to generate mercaptoazobenzene, carboxyazobenzene, or aminoazobenzene, respectively.

6. The method of claim 5, wherein the method comprises:

reducing the halogenated nitrobenzene in the presence of stannous chloride and concentrated hydrochloric acid to generate halogenated phenylamine;

oxidizing the halogenated phenylamine in the presence of sodium perborate and boric acid to generate a halogenated azobenzene;

reacting the halogenated azobenzene with potassium thiocarboxylate or thiocarboxylic acid in the presence of CuI and 1,10-phenanthroline to generate azobenzene thioester; and reacting the azobenzene thioester in the presence of TiCl$_4$ and Zn to generate mercaptoazobenzene.

7. The method of claim 5, wherein the method comprises:

reacting the nitrobenzene carboxylic acid and its derivatives in the presence of D-glucose and sodium hydroxide to generate carboxyazobenzene.

8. The method of claim 5, wherein the method comprises:

reacting p-phenylenediamine and its derivatives in the presence of potassium oxide to generate the aminoazobenzene.

9. A quantum dot material, comprising quantum dots and a quantum dot ligand, wherein at least one group on each benzene ring of one azobenzene molecule is connected to the quantum dots through the coordination bond, and groups on two different benzene rings of one azobenzene molecule are respectively connected to different quantum dots through the coordination bond, wherein the quantum dot ligand is an azobenzene compound represented by the following structural formula (I):

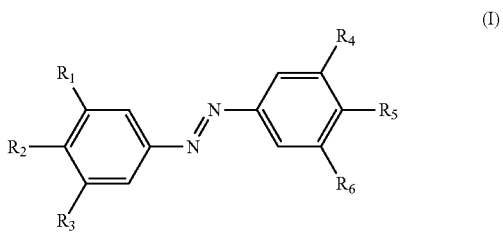

wherein $R_1$, $R_2$, $R_3$, $R_4$, $R_5$ and $R_6$ are independently —H, —$(CH_2)_n$SH, —$(CH_2)_m$COOH or —$(CH_2)_p$NH$_2$; and at least one of $R_1$, $R_2$ and $R_3$ is —$(CH_2)_n$SH, —$(CH_2)_m$COOH or —$(CH_2)_p$NH$_2$, and at least one of $R_4$, $R_5$ and $R_6$ is —$(CH_2)_n$SH, —$(CH_2)_m$COOH or —$(CH_2)_p$NH$_2$, wherein n, m and p is independently an integer from 0 to 3.

10. A quantum dot light emitting device, comprising a light emitting layer, the light emitting layer comprising quantum dots and the quantum dot ligand of claim 1, wherein at least one group on each benzene ring of one azobenzene molecule is connected to the quantum dots through the coordination bond, and groups on two different benzene rings of one azobenzene molecule are respectively connected to different quantum dots through the coordination bond.

11. The quantum dot light emitting device of claim 10, wherein each of the quantum dots is connected to the groups of at least two azobenzene molecules through the coordination bond.

12. The quantum dot light emitting device of claim 11, wherein a plurality of the quantum dots is connected with each other through a plurality of azobenzene molecules to form a network structure.

13. The quantum dot light emitting device of claim 10, wherein the quantum dot light emitting device further comprises an anode, a hole injection layer, a hole transport layer, an electron transport layer, and a cathode.

14. A method for preparing a quantum dot light emitting device, comprising:

coating a solution of the quantum dot material of claim 9; and subjecting the coated solution of the quantum dot material to treatment to form a light emitting layer, wherein at least one group on each benzene ring of one azobenzene molecule is connected to the quantum dots through the coordination bond, and groups on two different benzene rings of one azobenzene molecule are respectively connected to different quantum dots through the coordination bond.

15. The method of claim 14, wherein the method further comprises:

irradiating the solution of the quantum dot material with ultraviolet light before coating the solution of the quantum dot material; and subjecting the coated solution of the quantum dot material to ultraviolet thermal annealing treatment after coating the solution of the quantum dot material to form the light emitting layer.

16. The method of claim 14, wherein the method further comprises:
- sequentially forming an anode, a hole injection layer, and a hole transport layer, and forming the light emitting layer on the hole transport layer; and
- sequentially forming an electron transport layer and a cathode on the light emitting layer.

17. The method of claim 14, wherein the method further comprises:
- sequentially forming a cathode and an electron transport layer, and forming the light emitting layer on the electron transport layer; and
- sequentially forming a hole transport layer, a hole injection layer and an anode on the light emitting layer.

18. A display device comprising the quantum dot light emitting device of claim 10.

19. The display device of claim 18, wherein each of the quantum dots is connected to the groups of at least two azobenzene molecules through the coordination bond.

* * * * *